(12) United States Patent
Kang et al.

(10) Patent No.: US 10,262,971 B2
(45) Date of Patent: Apr. 16, 2019

(54) STACKED IMAGE SENSOR PACKAGE AND STACKED IMAGE SENSOR MODULE INCLUDING THE SAME

(71) Applicant: Samsung Electronics Co., Ltd., Suwon-si, Gyeonggi-do (KR)

(72) Inventors: Un-Byoung Kang, Hwaseong-si (KR); Yungcheol Kong, Cheonan-si (KR); Kyoungsei Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/469,837

(22) Filed: Mar. 27, 2017

(65) Prior Publication Data
US 2018/0040584 A1    Feb. 8, 2018

(30) Foreign Application Priority Data
Aug. 5, 2016    (KR) .................. 10-2016-0099934

(51) Int. Cl.
| | | |
|---|---|---|
| H01L 25/04 | (2014.01) | |
| H01L 23/49 | (2006.01) | |
| H01L 23/528 | (2006.01) | |
| H01L 27/146 | (2006.01) | |

(52) U.S. Cl.
CPC .......... *H01L 25/043* (2013.01); *H01L 23/49* (2013.01); *H01L 23/528* (2013.01); *H01L 27/14609* (2013.01); *H01L 27/14634* (2013.01); *H01L 27/1464* (2013.01); *H01L 27/14618* (2013.01); *H01L 27/14625* (2013.01); *H01L 27/14627* (2013.01); *H01L 27/14636* (2013.01); *H01L 27/14665* (2013.01); *H01L 2224/73204* (2013.01)

(58) Field of Classification Search
CPC .......... H01L 27/146–27/14893; H01L 25/043; H01L 25/0657; H01L 25/074; H01L 25/0756; H01L 25/117
See application file for complete search history.

(56) References Cited

U.S. PATENT DOCUMENTS

| | | | |
|---|---|---|---|
| 2006/0095639 A1* | 5/2006 | Guenin ................... | H01L 23/48 710/310 |
| 2008/0088014 A1* | 4/2008 | Adkisson .......... | H01L 27/14618 257/737 |
| 2009/0134436 A1 | 5/2009 | Nagano et al. | |

(Continued)

FOREIGN PATENT DOCUMENTS

WO    WO2016/143288 A1 *  9/2016

*Primary Examiner* — Tucker J Wright
(74) *Attorney, Agent, or Firm* — Harness, Dickey & Pierce, P.L.C.

(57) ABSTRACT

Provided are a stacked image sensor package and a packaging method thereof. A stacked image sensor package includes: a stacked image sensor in which a pixel array die and a logic die are stacked; a redistribution layer formed on one surface of the stacked image sensor, rerouting an input/output of the stacked image sensor, and including a first pad and a second pad; a memory die connected with the first pad of the redistribution layer and positioned on the stacked image sensor; and external connectors connected with the second pad, connecting the memory die and the stacked image sensor with an external device, and having the memory die positioned therebetween.

15 Claims, 17 Drawing Sheets

(56) References Cited

U.S. PATENT DOCUMENTS

| | | |
|---|---|---|
| 2010/0276572 A1* | 11/2010 | Iwabuchi ............ H04N 5/2253 250/208.1 |
| 2013/0277785 A1 | 10/2013 | Chen et al. |
| 2013/0320472 A1 | 12/2013 | Hwang et al. |
| 2014/0113398 A1 | 4/2014 | Wang et al. |
| 2014/0361347 A1 | 12/2014 | Kao |
| 2015/0064832 A1 | 3/2015 | Wan et al. |
| 2015/0115131 A1 | 4/2015 | Webster et al. |
| 2015/0115530 A1 | 4/2015 | Vanston |
| 2015/0200222 A1 | 7/2015 | Webster |
| 2015/0318322 A1 | 11/2015 | Borthakur et al. |
| 2015/0365567 A1 | 12/2015 | Umebayashi et al. |

* cited by examiner

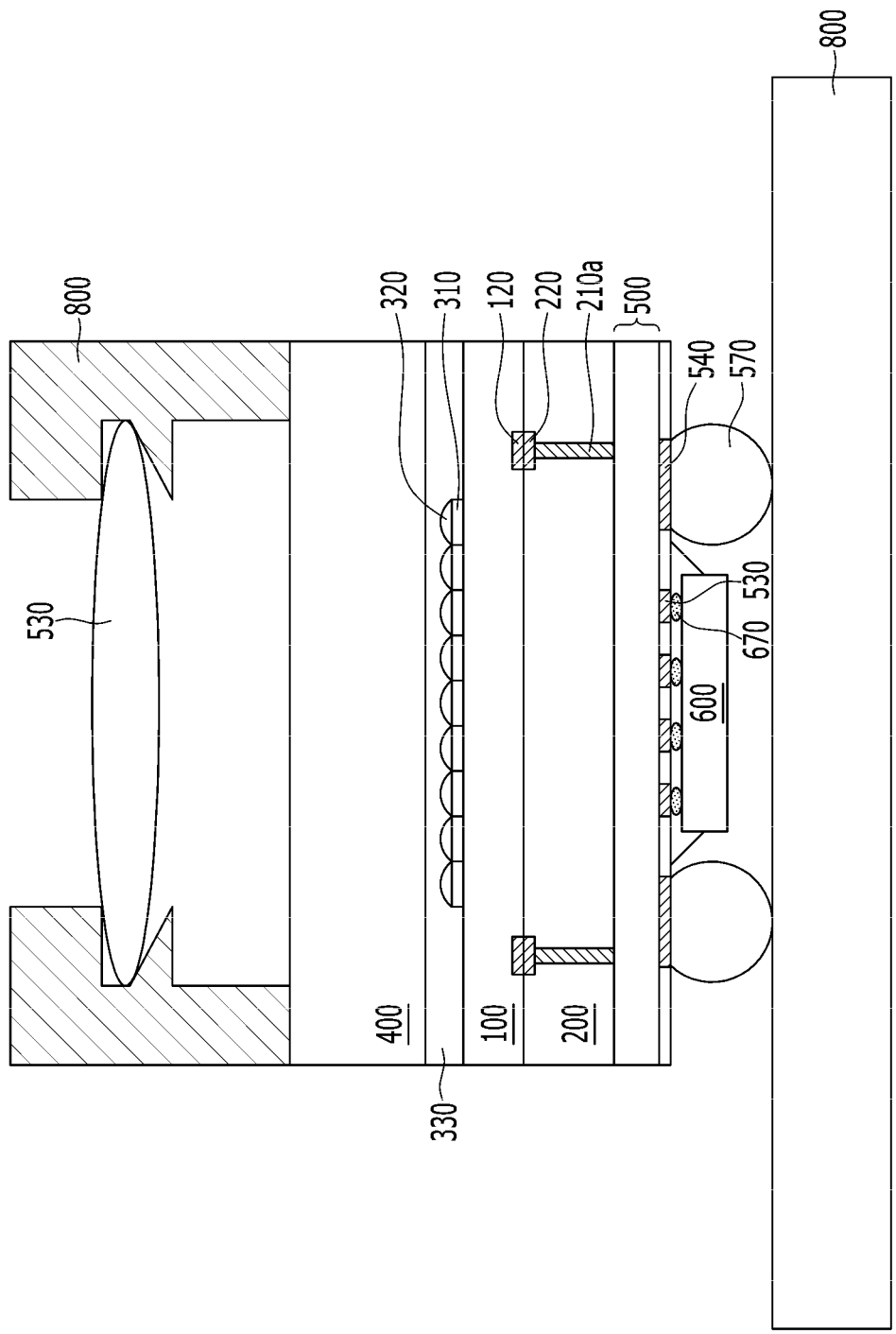

STACKED IMAGE SENSOR PACKAGE AND STACKED IMAGE SENSOR MODULE INCLUDING THE SAME

CROSS-REFERENCE TO RELATED APPLICATION

This application claims priority to and the benefit of Korean Patent Application No. 10-2016-0099934 filed in the Korean Intellectual Property Office on Aug. 5, 2016, the entire contents of which are incorporated herein by reference.

BACKGROUND

The inventive concepts relates to an image sensor package and an image sensor module including the same, and particularly, to a stacked image sensor package and a stacked image sensor module.

Since complementary metal oxide semiconductor (CMOS) image sensors are read line-by-line sequentially, a rolling shutter phenomenon occurs, and as a result, when a moving picture is picked up by a digital camera while moving, the image can be warped.

As an alternative to rolling shutter phenomenon, attempts are made to decrease a readout time by stacking a frame memory such as a DRAM in the image sensor.

Therefore, a new type package is desired that can package the frame memory which has already been manufactured in the image sensor without deformation of the frame memory, decreasing the yield without influence of a change in size or capacity, depending on a generation change of the image sensor.

The above information disclosed in this Background section is only for enhancement of understanding of the background of the inventive concepts and therefore it may contain information that does not form the prior art that is already known in this country to a person of ordinary skill in the art.

SUMMARY

Inventive concepts have been made in an effort to provide a method that can package the frame memory in the image sensor without deformation of the frame memory and a corresponding decrease of a yield, without an influence of a change in size or capacity depending on a generation change of the image sensor. Inventive concepts corresponding to package manufactured by the same have been made.

An example embodiment of the inventive concepts provides a stacked image sensor package including: a stacked image sensor in which a pixel array die and a logic die are stacked; a redistribution layer formed on one surface of the stacked image sensor, rerouting an input/output of the stacked image sensor, and including a first pad and a second pad; a memory die connected with the first pad of the redistribution layer and positioned on the stacked image sensor; and external connectors connected with the second pad, electrically connecting the memory die and the stacked image sensor with an external device, and having the memory die positioned therebetween.

Another example embodiment of the inventive concepts provides a stacked image sensor module including: a lens; a circuit substrate; and an image sensor package positioned between the lens and the circuit substrate, wherein a stacked image sensor in which a pixel array die and a logic die are stacked and a memory die are sequentially positioned below the lens, and external connectors electrically connecting the stacked image sensor and the memory die with the circuit substrate are positioned on the same plane as the memory die and the memory die is positioned between the external connectors.

Another example embodiment of the inventive concepts provides a stacked image sensor package comprising a redistribution layer; a first under bump metallurgy on the redistribution layer, a micro bump on the first under bump metallurgy, a second under bump metallurgy on the micro bump, and a memory die on the second under bump metallurgy.

According to example embodiments of the inventive concepts, a pixel array wafer and a logic wafer are stacked by a wafer-to-wafer bonding method to reduce the size of the entire die/module as compared to image sensors in the conventional art. Since a memory is packaged by a chip-on-wafer method by sorting the memory by the unit of a die, a memory having a desired capacity and a desired size can be packaged to an image sensor, without being influenced by a change in size or capacity depending on generation switching the image sensor.

When the memory is packaged by the wafer-to-wafer method, overlap loss is large and yield decreases due to a high-temperature process during wafer bonding, but according to the inventive concepts, since a memory chip determined as a good die is packaged by the chip on wafer method, the overlap loss is reduced and since the high-temperature process is not required, the yield decrease can be reduced, or alternatively prevented.

BRIEF DESCRIPTION OF THE DRAWINGS

FIG. 7 is a cross-sectional view schematically illustrating an image sensor module to which a stacked image sensor package is applied according to an example embodiment.

DETAILED DESCRIPTION OF EXAMPLE EMBODIMENTS

Figure 1A:
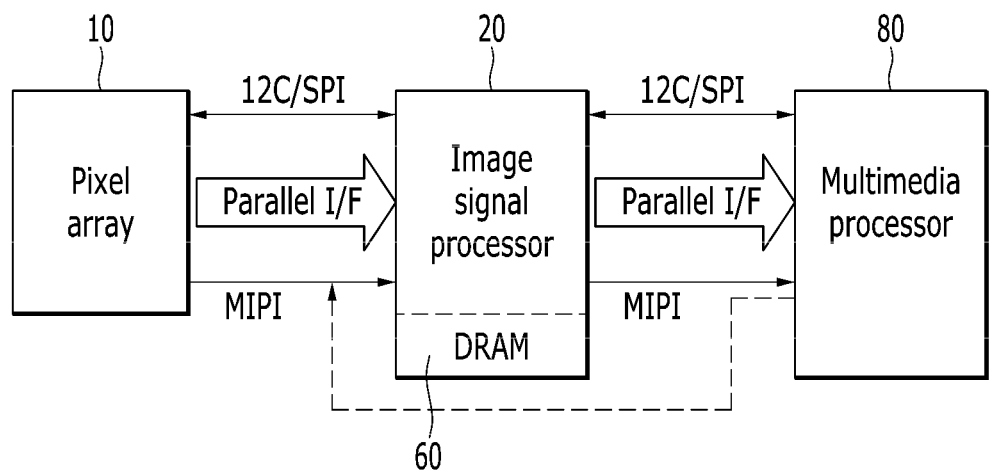
FIG. 1A is a configuration diagram of a mobile communication terminal having a camera function to which a stacked image sensor package is applied according to an example embodiment.
Figure 1B:
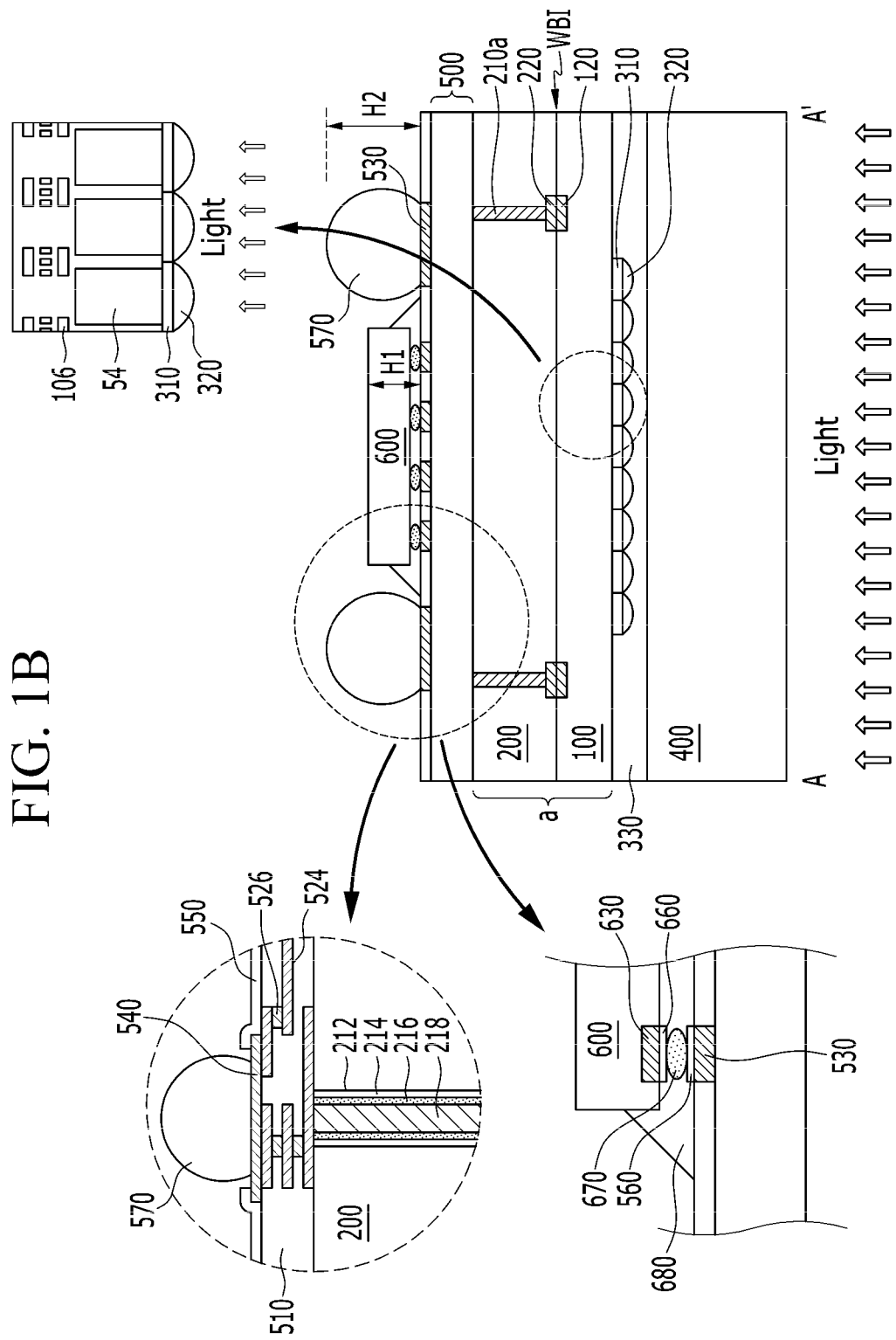
FIG. 1B is a cross-sectional view of a stacked image sensor package according to an example embodiment.
Figure 1C:
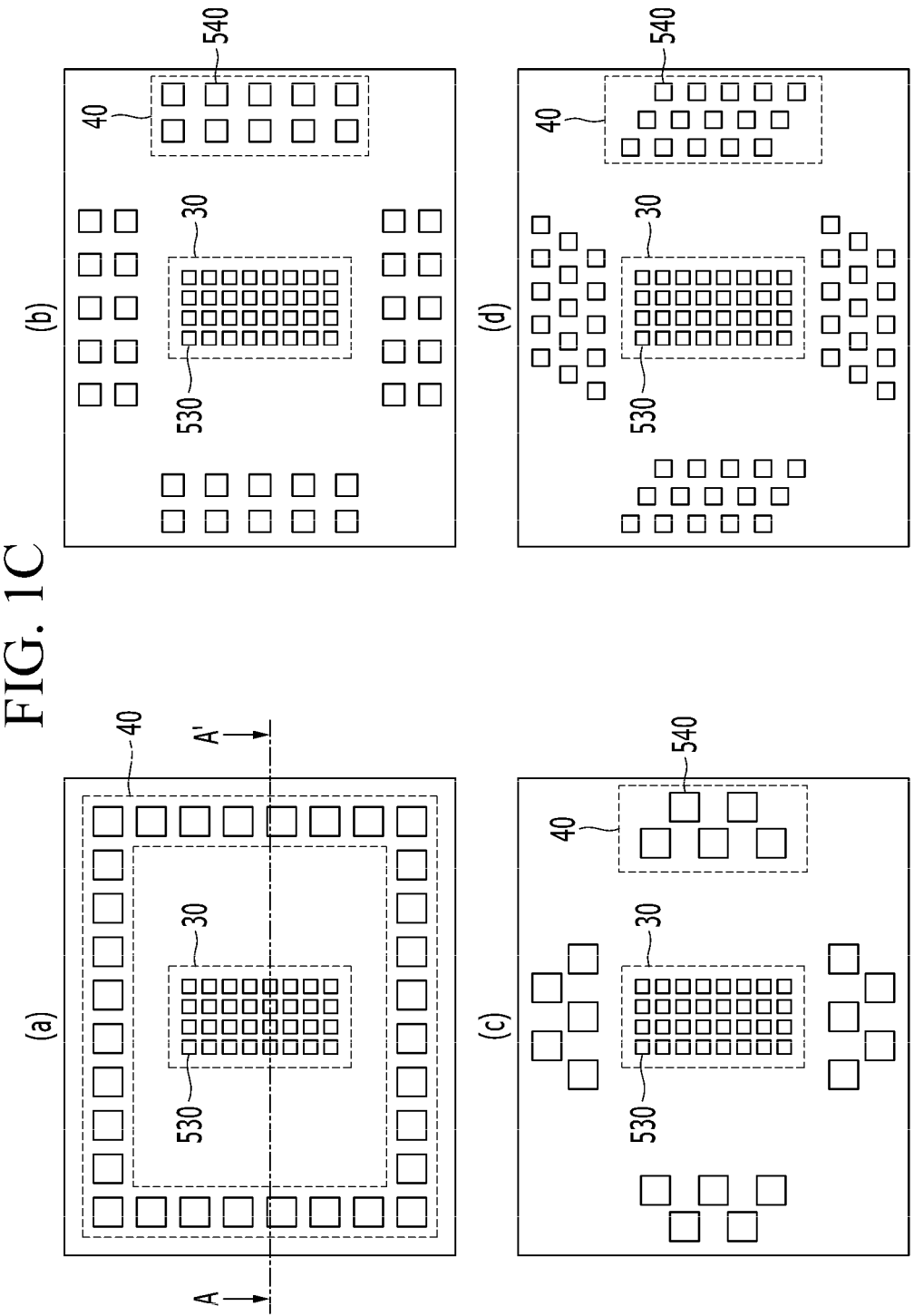
FIG. 1C illustrates various layouts of pads on the top of a redistribution layer according to an example embodiment.

FIG. 1A is a configuration diagram of a mobile communication terminal having a camera function to which a stacked image sensor package is applied according to an example embodiment. FIG. 1B is a cross-sectional view of a stacked image sensor package according to an example embodiment. FIG. 1C illustrates various layouts of pads on the top of a redistribution layer according to an example embodiment.

Referring to FIG. 1A, a terminal having a camera function includes a pixel array 10, an image signal processor 20, and a multimedia processor 80 are shown. The multimedia processor 80 controls the image signal processor 20 through an inter-integrated circuit (I2C)/serial peripheral interface (SPI), and the image signal processor 20 controls the pixel array 10 through the I2C/SPI according to an input command. The pixel array 10 includes a 2D array of light sensing elements and outputs an analog signal from pixel data. An image signal output from the pixel array 10 is transmitted through a parallel I/F, and/or a mobile industry processor interface (MIPI) which is a fast serial interface. The image signal processor 20 also transmits image information acquired by processing the corresponding image signal to the multimedia processor 80 through the parallel interface or the MIPI. The image signal processor 20 includes a frame memory (e.g., DRAM) 60 in a chip for post processing in recent years. For example, the DRAM 60 may be provided as the frame memory for the post processing (e.g., transmission, image rotation, and/or the like to make Still DIS, Motion DIS, CPS, Face detection, smile/blink detection, digital zoom, thumbnail, and jpeg correspond to one Vsync).

Referring to FIG. 1B, the pixel array 10, the image signal processor 20, and the frame memory 60 illustrated in FIG. 1A may be packaged as a stacked image sensor package.

In the stacked image sensor package, a pixel array die 100 on which the pixel array (10 of FIG. 1) is formed and a logic die 200 on which the image signal processor (20 of FIG. 1) is formed are stacked on each other to a stack image sensor a. When the pixel array die 100 and the logic die 200 are stacked on each other, the respective dies may be manufactured by the same, or different processes. For example, the pixel array die 100 may be manufactured by a 90 nm process and the logic die 200 may be manufactured by a 65 nm process. Therefore, an area of the die may be reduced by approximately 30% as compared to a case where a pixel array and logic are formed on one substrate only by the 90 nm process.

The stacked image sensor a is supported and protected by a transparent substrate 400. The pixel array die 100 includes a 2D pixel array 10, and a read circuit transistor array reading an analog signal as pixel data. The logic die 200 includes the image signal processor 20 configured to convert the analog signal Vout output from the pixel array die 100 into digital pixel data and processes the digital pixel data, a memory interface for inputting/outputting data in/to a frame memory chip 600, and/or the like. The frame memory die 600 is stacked on the logic die 200 in a chip-on-wafer bonding method. Accordingly, the frame memory die 600 and the logic die 200 are not connected with a through-via, or through-silicon via (TSV).

The pixel array die 100 and the logic die 200 are stacked by wafer-to-wafer bonding through respective connectors 120 and 220 to form the stacked image sensor a. In FIG. 1B, a case where the pixel array die 100 and the logic die 200 are stacked by the wafer-to-wafer bonding is illustrated, but in some cases, the pixel array die 100 and the logic die 200 may be stacked by the chip on chip method, of course.

The connector 120 may be an input/output pad, an input/output via, and/or the like. In FIG. 1B, a case where the connectors 120 and 220 are directly bonded is illustrated, but when the input/output pad or the input/output via of the pixel array die 100 and the input/output pad or the input/output via of the logic die 200 are not formed at a position to correspond to each other one to one, the pixel array die 100 and the logic die 200 may be wafer-bonded through a through-via, or through-silicon via (TSV), formed in the pixel array die 100 and/or redistribution layer.

A through-via 210a connected with the connector 220 and used for electrical connection with the frame memory die 600 and the outside is formed in the logic die 200 and the through-via 210a is exposed onto one surface of the logic die 200. The through-via 210a includes a barrier liner 214, a seed conductive layer 216, and a conductive material 218 filling a hole 212 sequentially formed on a side wall of the hole 212.

A redistribution layer 500 for rerouting an input and an output of the stacked image sensor a to a first pad 530 and a second pad 540 may be connected with the through-via 210a exposed onto one surface of the stacked image sensor a. In more detail, the redistribution layer 500 reroutes an electrical connection relationship between the connector 220 connected with the through-via 210a of the logic die 200 and serves as an I/O pad or a via, and the first pad 530 and the second pad 540.

The redistribution layer 500 may include a wiring layer 524 and a conductive via 526 formed in an interlayer insulating layer 510. A plurality of wiring layers 524 and conductive vias 526 may comprise a multi-layered structure. As a result, the redistribution layer 500 may be a multi-layered structure in which two or more wiring layers 524 and/or two or more conductive vias 526 are alternately stacked.

A passivation layer 550 for protection from external shock or moisture may be formed on the redistribution layer 500. A first passivation layer 532 may surround edge portions of the first pad 530 and the second pad 540, and expose a part of the top of each of the first pad 530 and the second pad 540. The passivation layer 550 may be made of an insulating material such as silicon nitride or polyimide. The first pad 530 and the second pad 540 may include at least one metal selected among tungsten (W,) aluminum (Al,) and copper (Cu.)

FIG. 1C illustrates various layouts of the first pad 530 and the second pad 540.

The first pad 530 as a pad for inputting and/or outputting a signal to and/or from the memory die 600 is located at a center 30 of the stacked image sensor a. The first pad 530 may be a micro bump pad. The size of soldering for a micro bump 670 is in the range of 5 to 10 μm. Therefore, the first pad 530 needs to have a size corresponding thereto.

The second pad 540 as a pad for inputting and/or outputting a final output of the stacked image sensor a is formed along a peripheral area 40 of one surface of the stacked image sensor a. The second pads 540 may be arranged along the peripheral area 40 in line (A), arranged to cross each other along the peripheral area 40 (B), arranged along the peripheral area 40 in plural columns (C), or arranged to cross each other in plural columns (D). When multiple second pads 540 are solder ball pads, the second pad 540 preferably has a pitch of at least 60 μm or more. FIG. 1B is a cross-sectional view taken along line A-A' of layout A of FIG. 1C.

Referring back to FIG. 1B, the first pad 530 allows the memory die 600 to be packaged into a memory chip (die)-on-wafer by a flip-chip packaging or bump packaging) method. In the flip-chip packaging, a conductive micro bump 670 on the surface of the memory die 600 is used as a wiring unlike the wire bonding packaging in which a wire is used as the connection. The micro bump 670 formed on the surface of the memory die 600 is upside down, and connected with the first pad 530. Under bump metallurgy UBM 560 and 660 for strengthening bonding force with the conductive micro bump 670 are formed on the first pad 530 and a pad 630 of the memory die 600, respectively.

As a result of the packaging, the pixel array die 100 and the logic die 200 are stacked at a wafer level by the wafer-to-wafer bonding. Therefore, a wafer bonding interface (WBI) is present between the pixel array die 100 and the logic die 200. The stacked image sensor a is supported and protected by the transparent substrate 400 and the memory die 600 is mounted by the chip-on-wafer method through the through-via 210a formed in the stacked image sensor a and the chip-on-wafer redistribution 500 formed on the stacked image sensor a. As a result, the memory die 600 mounted by the chip-on-wafer method is present on the top of the image sensor package and the memory die 600 is present among external connectors 570 for electrical connection with a PCB. Only when a height H2 of the external connector 570 is larger than a height H1 of the mounted memory die 600 corresponding to the thickness of the memory die, the connection with the PCB may be facilitated.

The image sensor according to the example embodiment may be a back-side illumination (BSI) image sensor as illustrated in FIG. 1B. The BSI image sensor is formed by manufacturing the light sensing element 54 in the wafer, forming a wiring layer 106 including the transistor arrays constituting a read circuit, and reversing a wafer, grinding a wafer on a rear side, and thinning the wafer, when the pixel array die 100 is formed. Thereafter, a color filter 310 and the microlens 320 are formed on the top of the light sensing element 54. That is, the wiring layer 106 is positioned on a back side of the light sensing element 54, based on a direction in which the light incident. Therefore, since a distance between the light sensing element 54 and the microlens 320 is shortened and the incident light is immediately incident in the light sensing element 54 without being distributed by the wiring layer 106, light receiving efficiency and light sensitivity of the light sensing element 54 may be improved.

FIGS. 2A to 2H are diagrams for describing a method for packaging the stacked image sensor according to the example embodiment described with reference to FIGS. 1A to 1C.

Figure 2A:
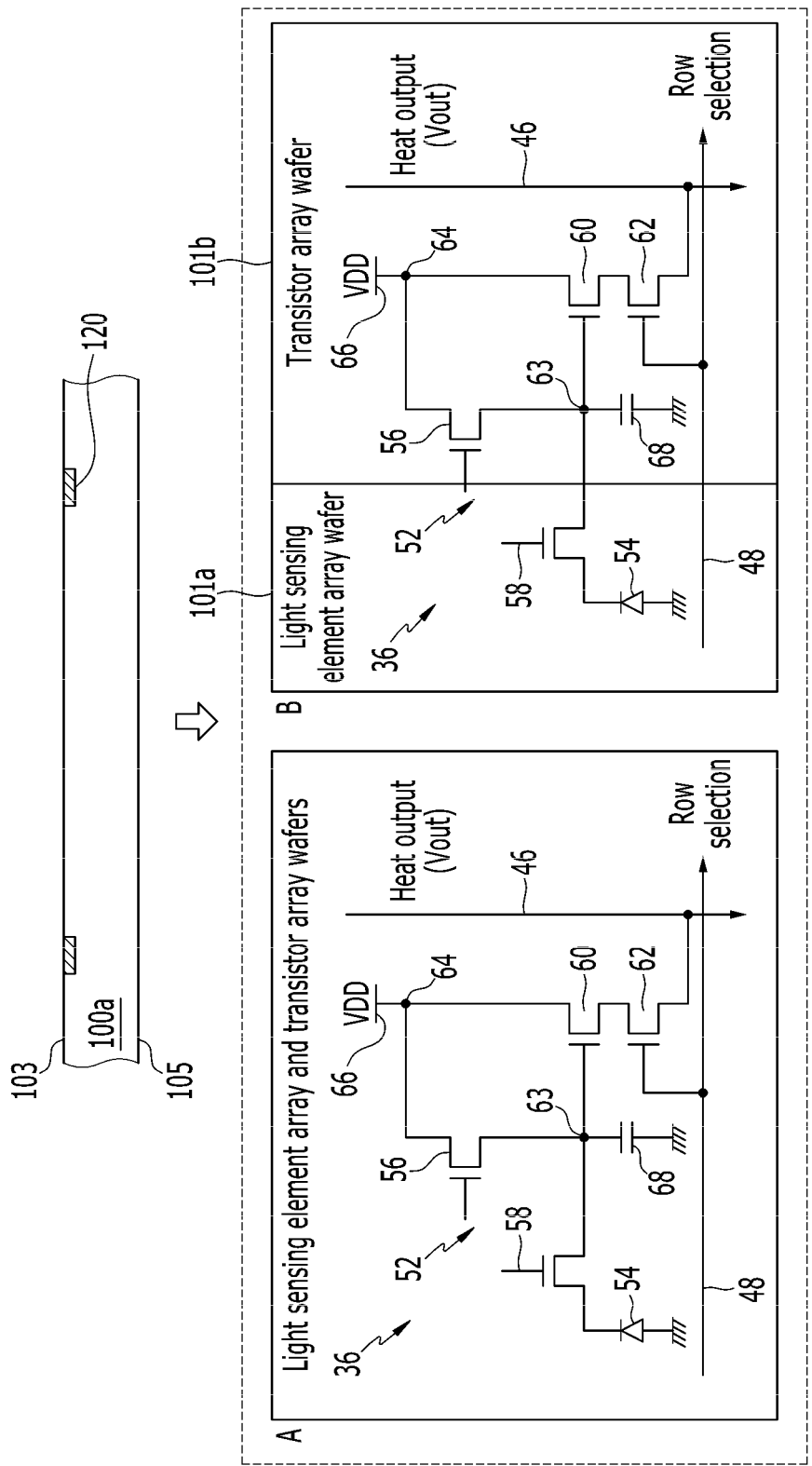
FIGS. 2A to 2H illustrate a method for packaging a stacked image sensor according to an example embodiment.

Referring to FIG. 2A, first, a pixel array wafer 100a is prepared. The pixel array wafer 100a may have illustrated configurations A and/or B.

A represents a case where a light sensing element array and a transistor array are integrated in one wafer. Each pixel constituting the light sensing element array may include a transistor array 52 and a light sensing element 54. The light sensing element 54 may absorb light and convert the absorbed light into an electric signal. The light sensing element 54 may be constituted by various light sensing elements including an inorganic light sensing element formed on a substrate (for example a silicon substrate), an organic light sensing element selectively absorbing light having a specific wavelength, or a photogate, and/or similar elements. The light sensing element 54 is coupled to a transmission gate 58 and the transmission gate 58 selectively connects the light sensing element 54 to a residual control circuit (transistor array) 52 of a pixel 36. The transmission gate 58 is coupled to a reset gate 56 and a source follower (SF) gate 60. The reset gate 56 and the SF gate 60 are coupled to a reference voltage node 64 connecting two gates to a reference voltage source (Vdd) 66. A row selection gate 62 is coupled to a row selection line 48 for the pixel 36. A floating spread node 63 including a charge storage component 68 may be coupled between the transmission gate 58, and the reset gate 56 and the SF gate 60.

Configuration B represents a case where the pixel array wafer 100a includes two wafers 101a and 101b stacked by wafer bonding. A light sensing element array wafer 101a and a transistor array wafer 101b are stacked to constitute the pixel array wafer 100a. When the light sensing element array wafer 101a and the transistor array wafer 101b are stacked as such and the light sensing element array wafer 101a and the transistor array wafer 101b are formed with the same integrity, an image sensor module may be miniaturized and when the light sensing element array wafer 101a and the transistor array wafer 101b are formed with the same size, the image sensor module may be highly integrated.

A pixel wafer connector 120 for transferring a heat output (Vout) value to a logic wafer 200a is included in a first surface 103 of the pixel array wafer 100a. The connector 120 may be a pad or via for I/O.

Figure 2B:
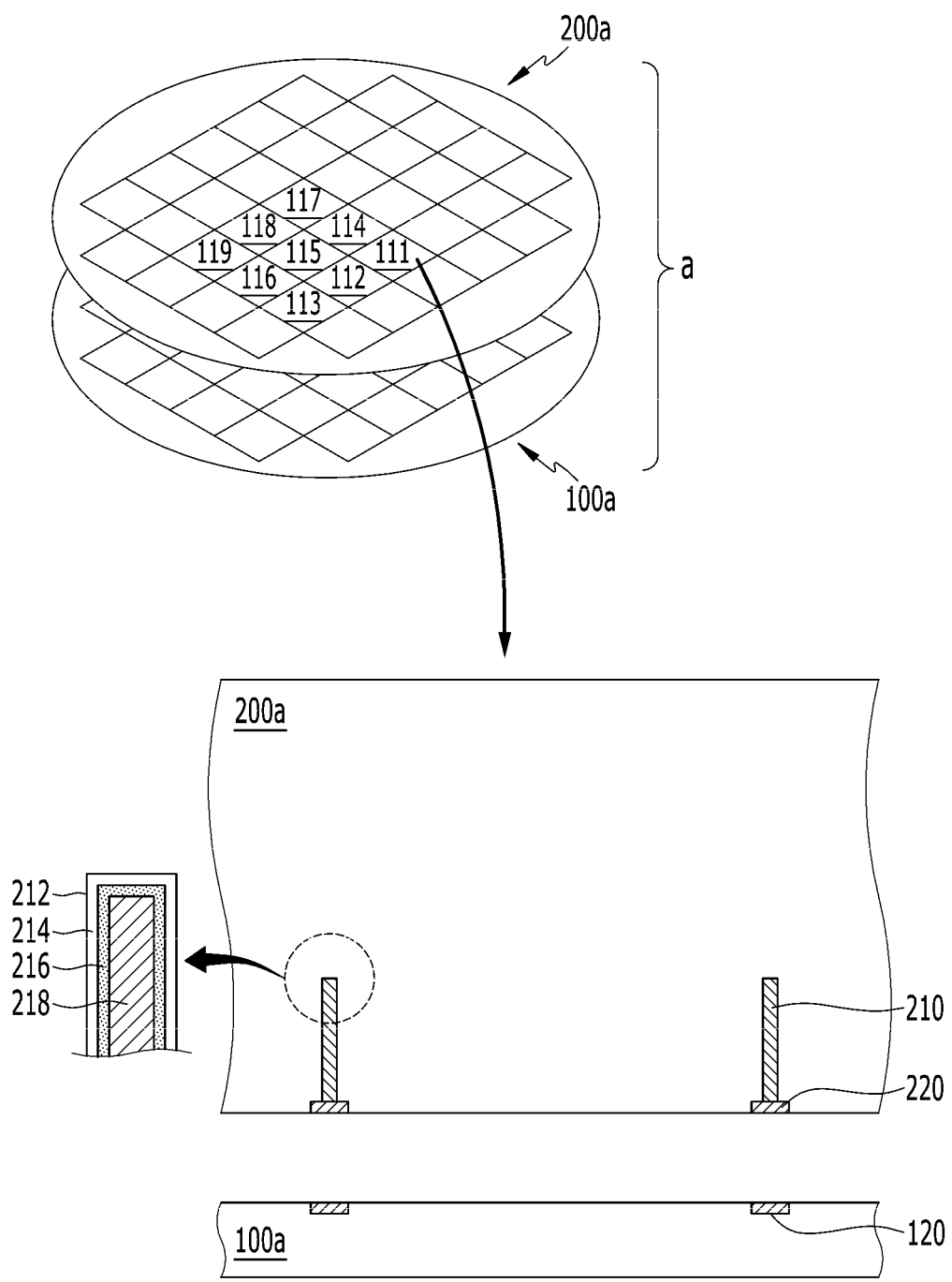

Referring to FIG. 2B, the logic wafer 200a to be stacked on the pixel array wafer 100A is presented. Each pixel array wafer 100a corresponding to the logic wafer 200a includes a plurality of dies 111 to 119.

The logic wafer 200a includes the connector 220 and a middle through-via 210. The connector 220 may be the pad or via for the I/O.

The middle through-via 210 is thereafter formed for connection with the redistribution layer for rerouting the electric signal of the connector 220 of the logic wafer 200a. The reason for using a term 'middle' is that the via has not penetrated the logic wafer 200a, but the via is thereafter completed as the through-via through the grinding process.

The middle through-via 210 may be formed by deep reactive ion etching or a laser drilling operation. In the deep reactive ion etching, a hole 212 having a processed surface which is smooth and close to a right angle relative to the surface of the substrate may be formed in the logic wafer 200a. The deep reactive ion etching method is a method that mixes gas such as $SF_4$, $SF_6$, $CF_4$, and/or the like containing a fluorine (F) component with oxygen gas to form $SiF_4$ through reaction of fluorine gas ($F_2$) and silicon (Si) dissolved herein to etch a wafer, for example a silicon wafer. To this end, a part to be etched on the silicon wafer is first selected by using a hard mask such as a metallic mask or a soft mask such as photoresist. That is, since the photoresist is patterned through an exposure process, and thereafter the fluorine gas does not contact a part where the photoresist is formed, the part is not etched and in a part where the photoresist is opened, the fluorine gas reacts with the silicon wafer to etch the substrate. Thereafter, when the mask is removed, a comparatively large hole 212 in which an aspect ratio is 1:10 or more may be formed.

After the home 212 is formed, the barrier liner 214 and the seed conductive layer 216 are sequentially formed, and thereafter the hole 212 is filled with the conductive material 218 to form the middle through-via 210. The barrier liner 214 may be formed by depositing oxide, nitride, carbide, and/or the like by a CVD method. The seed conductive layer 216 may be formed by sputtering titanium (Ti,) titanium nitride (TiN,) tantalum (Ta, tantalum nitride (TaN,) ruthenium (Ru,) cobalt (Co,) manganese (Mn,) tungsten nitride (WN,) nickel (Ni,) and/or nickel boron (NiB.) The conductive material 218 may be formed by applying at least one material selected among Cu alloys including copper (Cu,) copper tin (CuSn,) copper magnesium (CuMg,) copper nickel (CuNi, copper zinc (CuZn,) copper palladium (CuPd,) copper gold (CuAu,) copper rhenium (CuRe,) copper tungsten (CuW,) and/or the like, W, a W alloy, Ni, Ru, and Co by using other metal depositing method such as electrolytic plating or physical vapor deposition (PVD.)

Figure 2C:
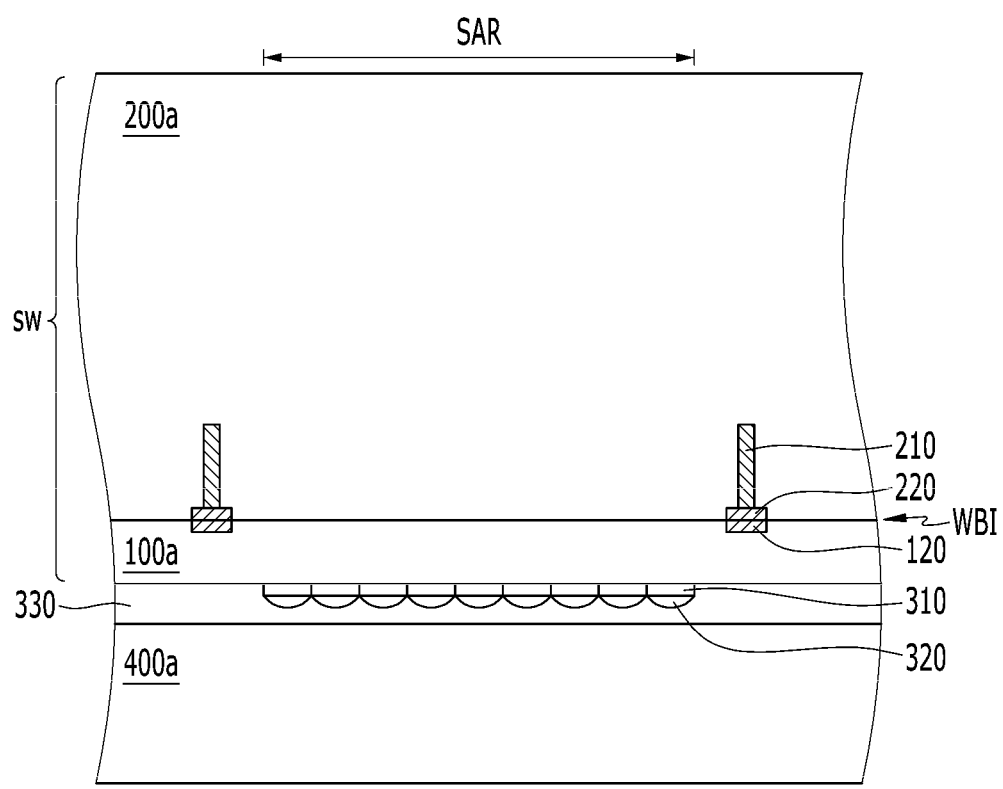

Referring to FIG. 2C, the pixel array wafer 100a and the logic wafer 200a are stacked to form a stacked wafer SW.

The pixel array wafer 100a and the logic wafer 200a may be stacked by the wafer-to-wafer bonding. The wafer-to-wafer bonding may be performed by various methods including direct bonding, mixed bonding, and/or the like. For example, the wafer-to-wafer bonding may be implemented by various methods including nitride bonding, metal bonding, oxide bonding, and/or the like. As a result of the wafer bonding, the wafer bonding interface (WBI) is present between the pixel array wafer 100 and the logic wafer 200.

Subsequently, the color filter array 310 and the microlens 320 are formed at a light sensing element array region (SAR). The color filter array 310 selectively transfers an optical spectrum to a light sensing element (54 of FIG. 2A) corresponding thereto. The color filter array 310 may be transformed to various forms according to a normal bayer pattern and a structure of the image sensor. The microlens 320 focuses the incident light on the light sensing element 54 through the color filter array 310. When the light sensing element 54 is formed by using not an inorganic photodiode formed on the silicon substrate but an organic photoelectric conversion layer selectively absorbing the light having the specific wavelength, the color filter array 310 may be omitted.

Subsequently, a bonding layer 330 is formed on the microlens 320, and thereafter a transparent wafer 400a is bonded. The bonding layer 330 may be made of a transparent material having elasticity. The bonding layer 330 may be made of a permanent bonding material or a temporary bonding material. When a function to interrupt contamination of the microlens 320 by minute particles by interrupting an external environment by attaching the transparent wafer 400a is adopted, the bonding layer 330 may be made of the permanent bonding material. A case where the temporary bonding material is used will be hereinafter described in more detail in other example embodiment. An infrared blocking layer coated with the transparent wafer 400a or the infrared blocking layer may be formed by a subsequent process. When the infrared blocking layer is formed by the subsequent process, the infrared blocking layer may be formed before dicing. As the transparent wafer 400a, a glass wafer having a thickness of approximately 200 μm to 350 μm may be used and the transparent wafer 400a has the same size as the pixel array wafer 100a and the logic wafer 200a. Therefore, the transparent wafer 400a may support the pixel array wafer 100a and the logic wafer 200a in the subsequent process (e.g., the grinding process.)

Figure 2D:
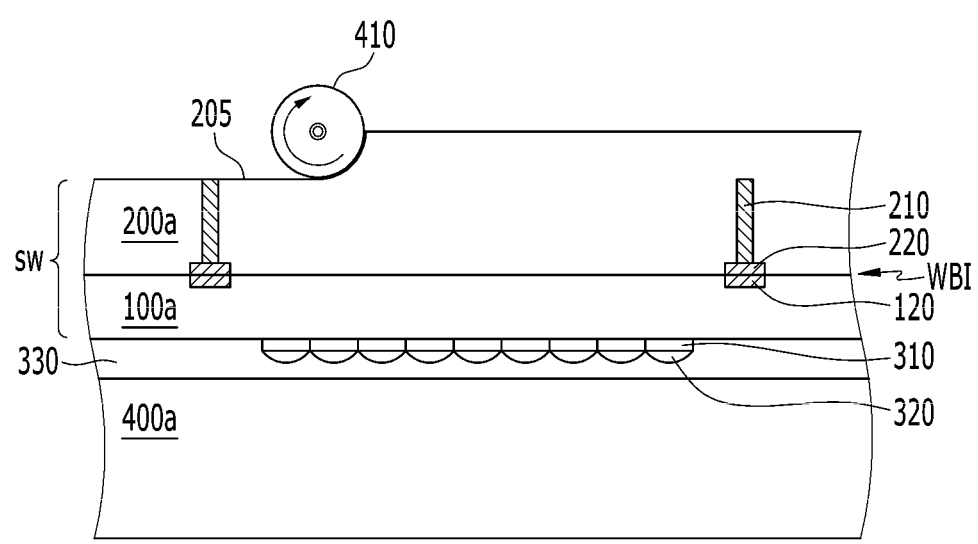

Referring to FIG. 2D, the logic wafer 200a is ground to be thinned by using the transparent wafer 400a as a support. The logic wafer 200a may be thinned up to a point where the logic wafer 200a is sufficiently thin so that the bottom of the middle through-via 210 is exposed. If actuation of the image sensor is moderate, grinding may be performed up to the point where the logic wafer 200a is sufficiently thin. When the pixel array wafer 100a has a thickness of approximately 30 μm or less, that is, is very thin, the pixel array wafer 100a has a thickness of 3 μm to 5 μm, the logic wafer 200a may also be thinned to a thickness of approximately 100 μm or less from a thickness of approximately 600 μm to 700 μm through the grinding process. As a result, the through-via 210a penetrating the logic wafer 200a is complete.

Figure 2E:
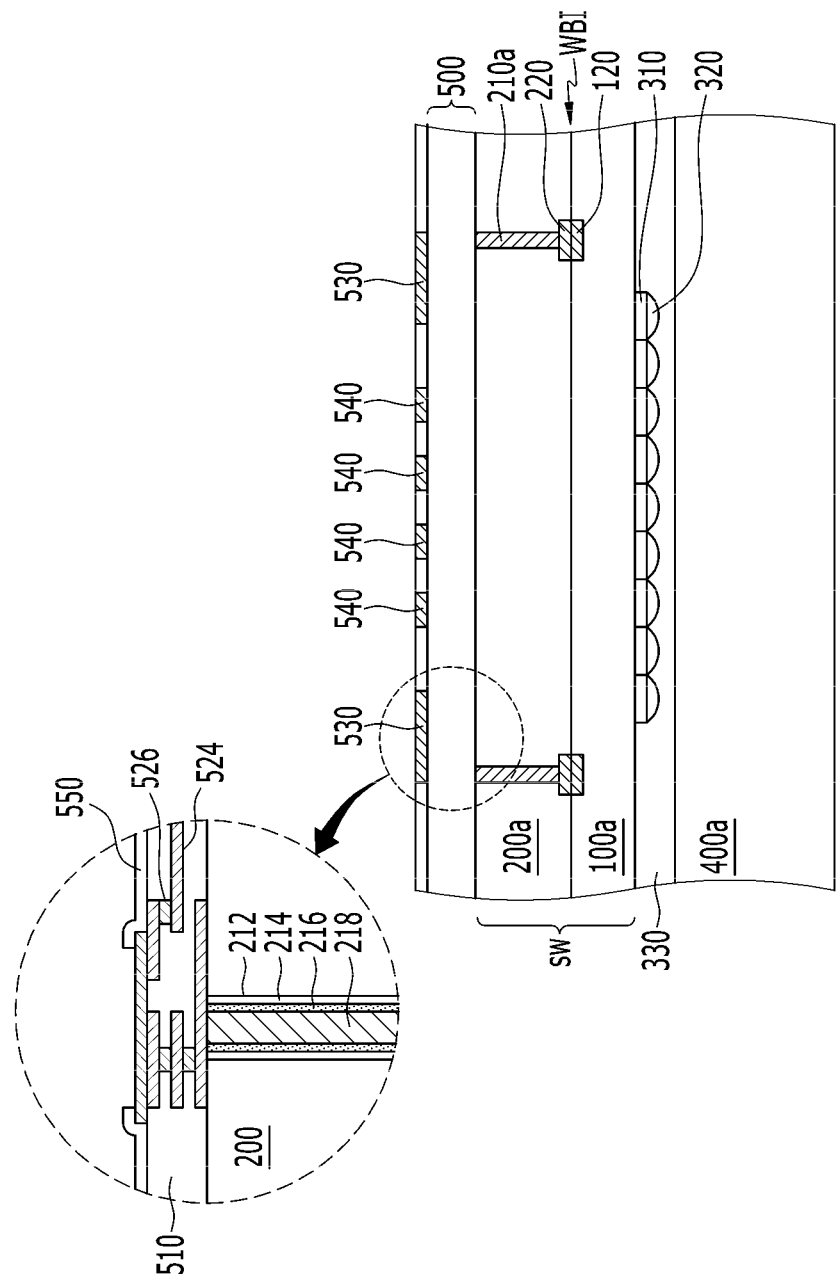

Referring to FIG. 2E, a redistribution layer 500 formed on one surface of the stacked wafer SW and used for rerouting the input/output of the stacked wafer SW is formed.

The first pad 530 and the second pad 540 are included on the top of the redistribution layer 500. The first pad 530 is a pad for inputting/outputting the signal in/to the memory die and the second pad 540 is a pad for inputting/outputting the final output of the image sensor. The first pad 530 may be a micro bump pad. The second pad 540 may be a solder ball pad or copper pillar pad.

The redistribution layer 500 may include the wiring layer 524 and the conductive via 526 formed in the interlayer insulating layer 510. The wiring layer 524 and the conductive via 526 may be formed by a wiring barrier layer and a wiring metal layer. The wiring barrier layer may include at least one material selected among Ti, TiN, Ta, and TaN. The wiring metal layer may include at least one metal selected among W, Al, and Cu. The wiring layer 524 and the conductive via 526 may be made of the same material. Alternatively, the wiring layer 524 and the conductive via 526 may be configured to at least partially include different materials. A plurality of wiring layers 524 and conductive vias 526 may form a multi-layered structure. The redistribution layer 500 may be a multi-layered structure in which two or more wiring layers 524 or two or more conductive vias 526 are alternately stacked.

A passivation layer 550 for protection from external shock and/or moisture may be formed on the redistribution layer 500. A first passivation layer 532 may surround edge portions of the first pad 530 and the second pad 540 and expose a part of the top of each of the first pad 530 and the second pad 540. The passivation layer 550 may be made of an insulating material such as silicon nitride and/or polyimide. The first pad 530 and the second pad 540 may include at least one metal selected among W, Al, and Cu.

Figure 2F:
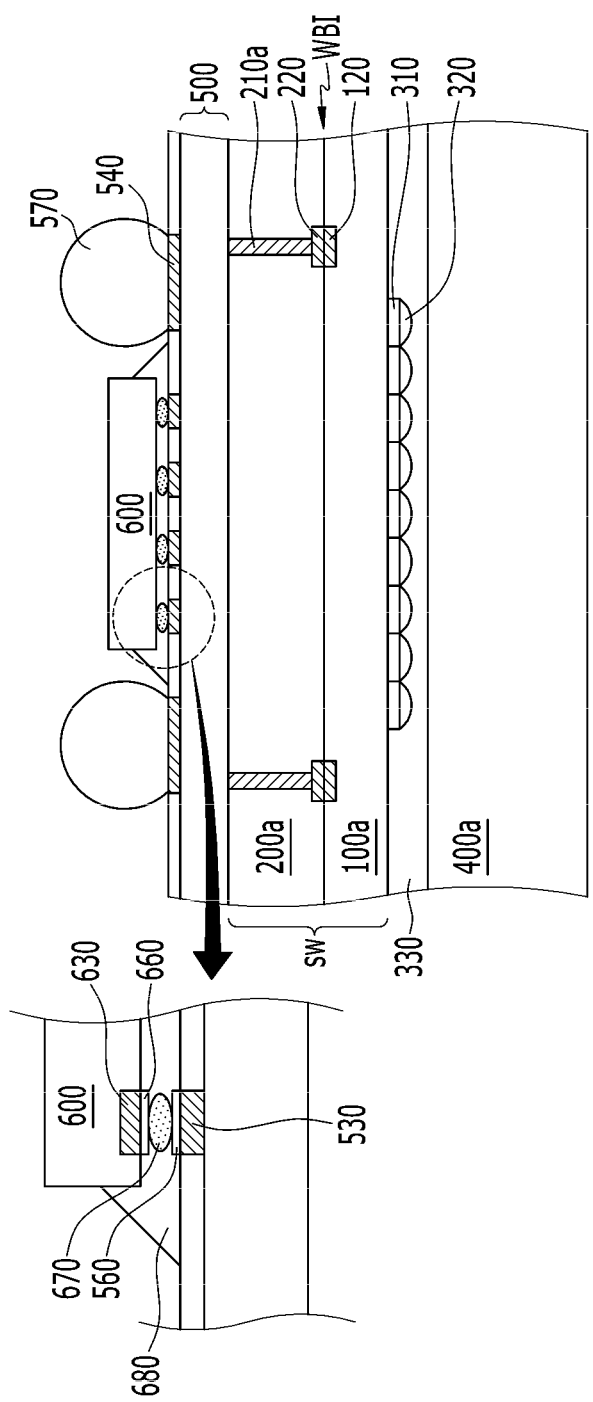

Referring to FIG. 2F, the external connector 570 is formed and the memory die 600 is mounted by the chip (die)-on-wafer method. Referring to FIG. 2F, the external connector 570 is formed and the memory die 600 is mounted by the chip (die)-on-wafer method. The UBM 560 and 660 may be formed by a nickel/gold (Ni/Au) plated layer. The UBM 560 and 660 is formed by metallic film deposition using an evaporation method or a sputtering method and patterning using a polymer. The patterning using the polymer may be performed by applying a liquid polymer, and thereafter patterning the applied polymer by a lithography process or drying the polymer by a dry film. As a material of the conductive bump 670, materials such as Ni and Au which may stably attach the first pad 530 and the pad 630 of the memory chip while connecting the first pad 530 and the pad 630 of the memory chip may be used. The conductive bump 670 is formed by a method such as an evaporation method, an electroplating method, an electroless plating method, a stencil printing method, a jet printing method, and/or a pick and place method. An underfill 680 is formed on the side of the memory die 600.

The external connector 570 is connected with the second pad 540 to connect the stacked wafer SW and the memory die 600 with an external device (e.g., the PCB).

The eternal connector 570 connected with the second pad 540 may be formed by a solder ball, but a conductive pillar such as a copper pillar may be applied. A column, a pillar, a ball, and/or the like may be all available shapes for the external connector 570. When the external connector 570 is formed by the solder ball, a heat reflow that applies solder paste and forms the solder ball is performed to form the external connector 570. As the solder ball, solder balls such as Sn/Pb, Sn/Ag, Sn/Ag/Cu, and/or the like may be used. UBM (not illustrated) for strengthening bonding force with the external connector 570 may be formed on the second pad 540. When the copper pillar is applied, it may be advantageous in that stress by the solder is not applied to the wafer.

Figure 2G:
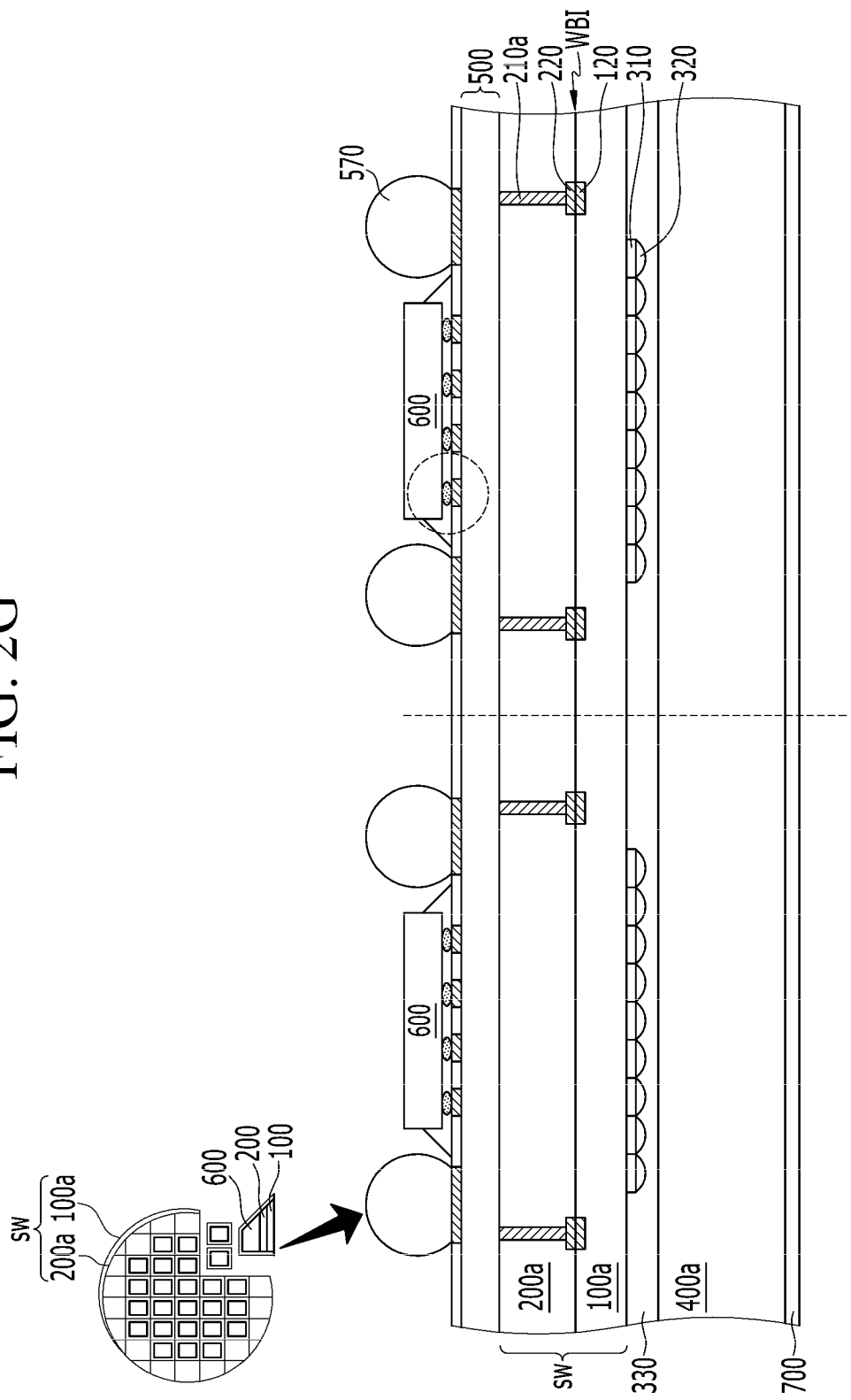

Referring to FIG. 2G, a wafer mounting tape 700 is attached onto the back side of the transparent wafer 400a. The wafer mounting tape 700 having a large thickness of at least 100 m or more is used. Subsequently, a cutting process is performed in order to separate the image sensor package for each unit area. The transparent wafer 400a is completely cut into each unit area and preferably, even the inside of the wafer mounting tape 700 is cut to completely expose the side wall of the transparent wafer 400a. General dicing equipment is used and as a blade, a blade which may effectively cut both silicon and glass is selected and an optimal dicing process condition is selected.

Figure 2H:
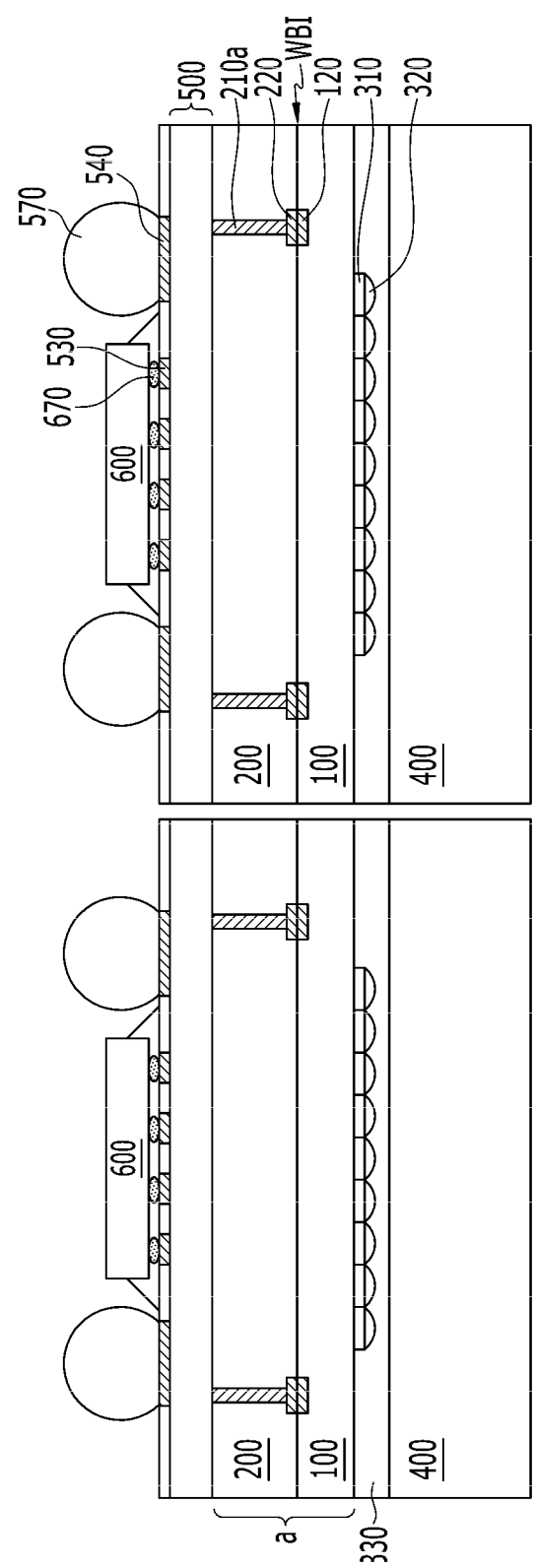

Referring to FIG. 2H, the wafer mounting wafer 700 is removed and the completed stacked image sensor package is separated.

According to the packaging method described with reference to FIGS. 2A to 2H, the pixel array wafer and the logic wafer are stacked by the wafer-to-wafer bonding method, and as a result, it may be advantageous in that the size of the entire die/module may be reduced as compared to the image sensors in the conventional art. Since the memory is packaged by the chip (die)-on-wafer method by sorting the memory by the unit of the die while maintaining such an advantage, a memory having a desired capacity and a desired size may be packaged to the image sensor without being influenced by a change in size or capacity depending on generation switching the image sensor.

When a memory wafer is stacked on an image sensor wafer by the wafer-to-wafer bonding method like the conventional art, the sizes of the image sensor and the memory die are desired to be the same as each other. Therefore, since a memory device having a small capacity cannot be enlarged, the total number of dies cannot be reduced as compared to inventive concepts a case where the die is separately formed. By using a detailed numerical value as an example, as the DRAM which is a frame memory of a high-resolution image sensor, which is currently manufactured, the size of a single DRAM die is very small with a capacity of approximately 2 gigabytes. However, when the DRAM is stacked by the wafer-to-wafer bonding method, the number of dies which may be produced based on the same wafer is reduced from 4000 to 1500. According to the inventive concepts, a significant number of the total number (e.g., 4000) of dies which may be produced based on the same wafer may be used for the packaging.

Further, when the stacked image sensor wafer and the memory wafer are stacked by the wafer-to-wafer bonding method, in the case where one the stacked image sensor wafer or the memory wafer is an inferior wafer, the one wafer is processed as the inferior wafer, and as a result, overlap yield loss occurs. Since a high-temperature process are performed at 350° C. or higher several times, the yield of the memory may deteriorate. Therefore, according to the inventive concepts, since only the inferior die among the memory dies is excluded from the chip (die)-on-wafer package, the overlap yield loss may be reduced and since the chip (die)-on-wafer process may be performed by a process at a temperature having a maximum of up to 230° C. for 10 seconds, characteristic deterioration of the memory vulnerable to heat processes may be prevented, or alternatively reduced.

Figure 3:
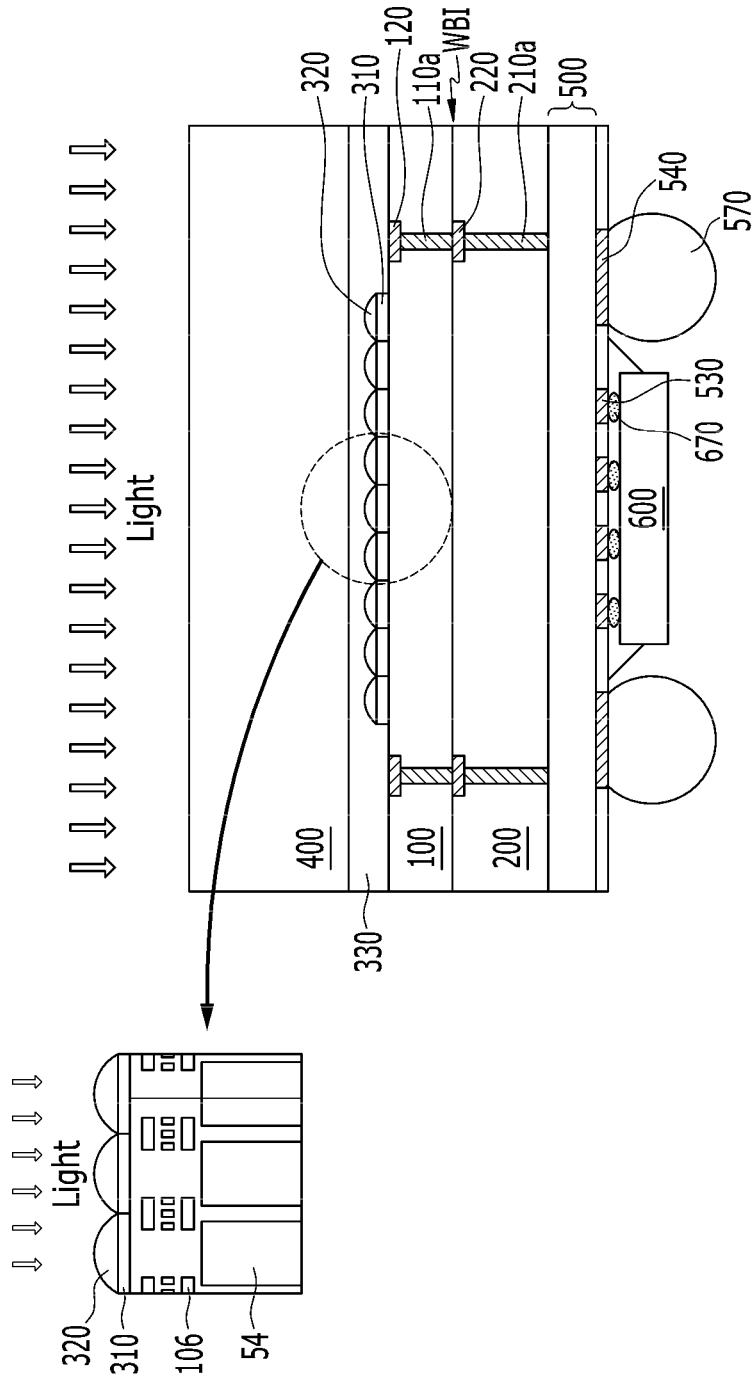
FIG. 3 is a cross-sectional view of a stacked image sensor package according to another example embodiment.

FIG. 3 is a cross-sectional view of a stacked image sensor package according to another example embodiment. Referring to FIG. 3, the image sensor according to another example embodiment may be implemented by a front side illumination (FSI) image sensor. The image sensor is substantially the same as the back side illumination image sensor illustrated in FIGS. 1A to 2H in terms of various components, and like reference numerals refer to like elements.

Referring to FIG. 3, the pixel array wafer 100 and the logic wafer 200 are stacked by the wafer-to-wafer bonding to form the stacked image sensor. The stacked image sensor is supported and protected by a transparent substrate 400. In the case of the front side illumination image sensor, the light sensing element 54 in the wafer and the wiring layer 106 including the transistor array constituting a read circuit are sequentially formed, and thereafter the color filter array 310 and the microlens 320 are formed on the wiring layer 106, as compared to the example embodiment illustrated in FIG. 1B. When the front side illumination image sensor is applied, the input/output pad 120 of the pixel array die 100 may not be present at a position to face the input/output pad 220 of the logic die 200. Therefore, the through-via 110a for connecting the input/output pad 120 of the pixel array die 100 with the input/output pad 220 of the logic die 200 may be further included in the pixel array die 100. In the case of the front side illumination image sensor, the wiring layer 106 is positioned above the light sensing element 54, based on a direction in which light is incident, but a process such as wafer polishing is not required.

Figure 4A:
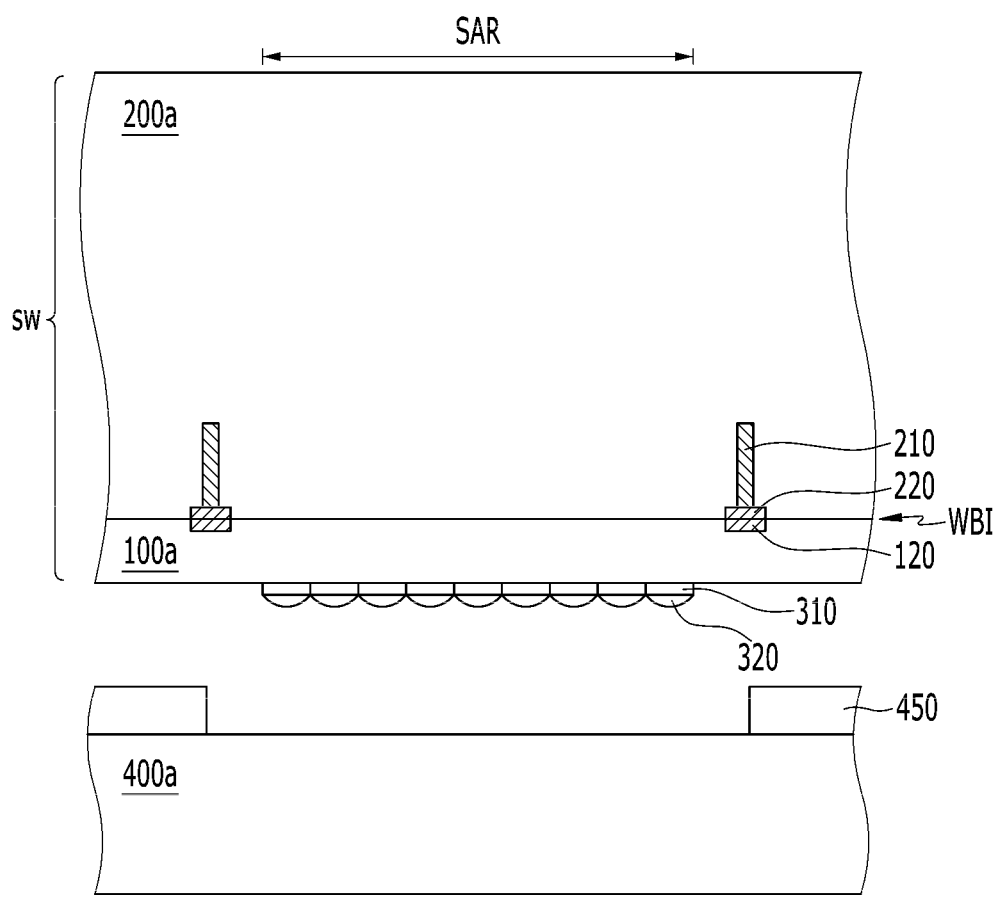
FIGS. 4A and 4B are cross-sectional views illustrating a packaging method and a stacked image sensor package manufactured thereby according to yet another example embodiment of the inventive concepts.
Figure 4B:
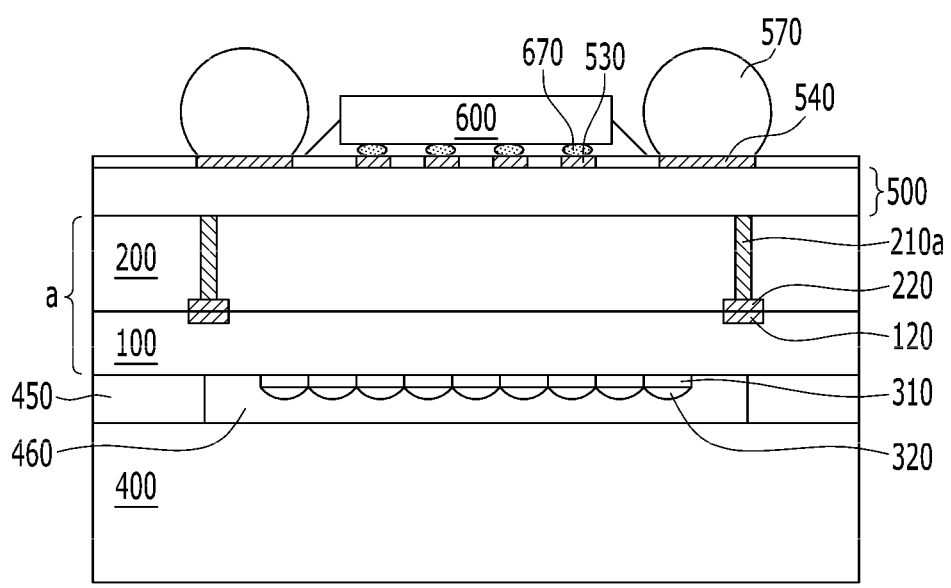

FIGS. 4A and 4B are cross-sectional views illustrating a manufacturing method and a stacked image sensor package manufactured thereby according to yet another example embodiment of the inventive concepts.

Referring to FIG. 4A, a partition 450 is formed on one surface of the transparent wafer 400a before the transparent wafer 400a is bonded. The partition 450 may be formed in a photosensitive bonding pattern, or an anisotropic conductive layer pattern. The partition 450 is used for implementing a kind of semi-hermetic package form that protects an image sensing area. The partition 450 is formed to be higher than the microlens 320. When the partition 450 is formed in the photosensitive bonding pattern, a photosensitive polymer such as benzocyclobutene (BCB) may be used. That is, the BCB material may be coated on the transparent wafer 400a by using a spin coating process, and thereafter the partition 450 having a lattice structure may be formed by using mask and lithography processes. When the partition 450 is formed by using an anisotropic conductive film (ACF), a part where the microlens 320 is formed, which corresponds to the element array region (SAR) for image sensing is removed by a punching process to form the partition 450 by using ACF showing a quadrangular belt shape.

Subsequently, the transparent wafer 400a is attached to the stacked wafer SW. When the partition 450 is formed in the photosensitive bonding pattern, the transparent wafer 400a and the stacked wafer SW are arranged, and thereafter the transparent wafer 400a and the stacked wafer SW are thermally compressed by applying heat and pressure to bond the transparent wafer 400a to the stacked wafer SW. In this case, the partition 450 which is configured in the photosensitive bonding pattern is attached by thermal compression. When the partition 450 is formed by the ACF, the ACF in which the punching process is performed is arranged between the transparent wafer 400a and the stacked wafer SW, and thereafter the transparent wafer 400a and the stacked wafer SW may be bonded to each other by the thermal compression or ultrasonic connection.

Thereafter, a process of forming the redistribution layer 500, forming the external connector 570, and mounting and dicing the memory die 600 is performed in the same method described with reference to FIGS. 2E to 2H, to complete the stacked image sensor package illustrated in FIG. 4B. An air gap 460 defined by the partition 450 is formed in the stacked image sensor package as illustrated in FIG. 4B. The air gap 460 is formed between the microlens 320 and the transparent substrate 400 by the partition 450. Accordingly, a material (e.g., a permanent bonding material) having a different refractive index is present between the microlens 320 and the transparent substrate 400, to prevent the light receiving efficiency from being reduced.

Figure 5:
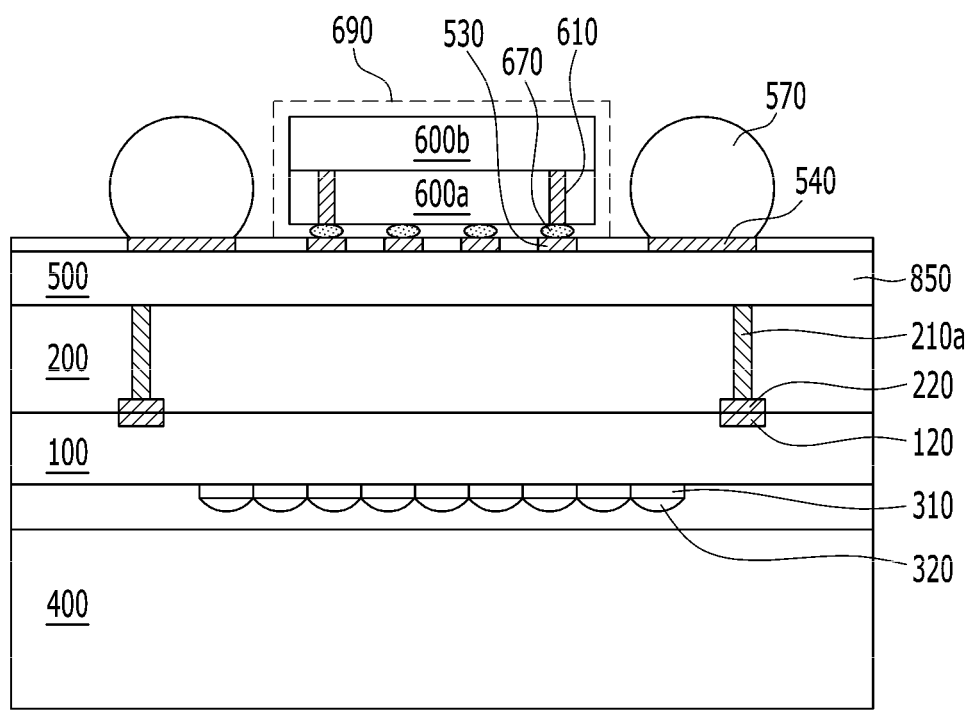
FIG. 5 is a cross-sectional view of a stacked image sensor package according to yet another example embodiment.

FIG. 5 is a cross-sectional view of a stacked image sensor package according to yet another example embodiment. Referring to FIG. 5, yet another example embodiment includes multiple memory dies 600a and 600b. A first memory die 600a and a second memory die 600b are connected to each other through a through-via 610 and the memory dies 600a and 600b, may be stacked and mounted in a form to be protected by an overmolding 690.

When the stacked image sensor package includes the stacked memory dies, data transmission rate may be increased by applying a method that stores a first half of the pixel arrays in the first memory die 600a and a second residual half in the second memory die 600b.

Furthermore, the first memory die 600a may be used as an image data region storing image data and the second memory die 600b may be used as a defective information region storing defective pixel information.

In FIG. 5, a case where the multiple memory dies 600a and 600b are stacked and mounted is illustrated, but if a substantially arbitrary die size is permitted, a plurality of memory dies may be mounted in line on the same plane.

Figure 6:
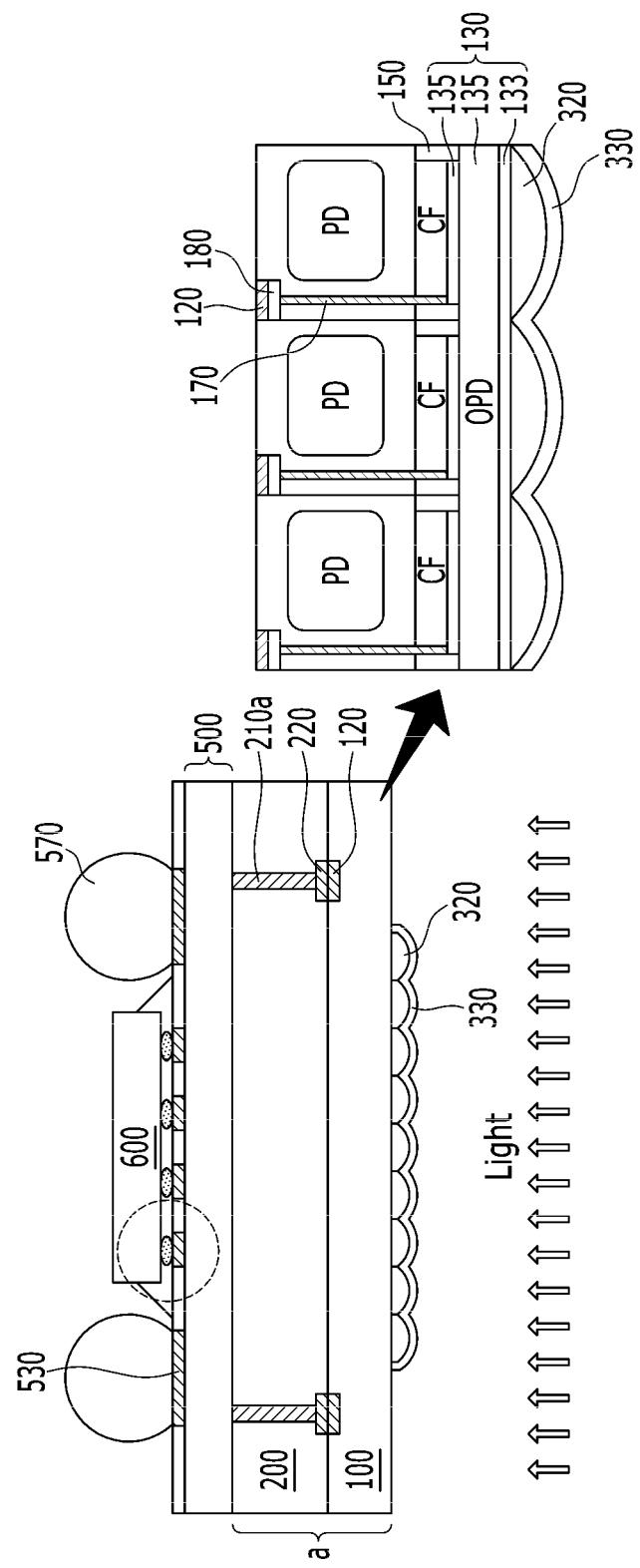
FIG. 6 is a cross-sectional view of a stacked image sensor package according to yet another example embodiment.

FIG. 6 is a cross-sectional view of a stacked image sensor package according to yet another example embodiment.

In order to manufacture the stacked image sensor package illustrated in FIG. 6, as the bonding material (see 330 of FIG. 2C) that bonds the transparent wafer 400a and the stacked wafer SW, a temporary bonding material may be used. After the temporary bonding material is applied, the processes described with reference to FIGS. 2D to 2F are sequentially performed. In this case, the transparent wafer 400a is applied for a support purpose in the polishing process. The temporary bonding material may be a heat release adhesive used in a semiconductor process. Therefore, after the mounting of the memory die 600 and the forming of the external connector 570 are completed, the temporary bonding material is released by applying heat at a temperature greater than or equal to a threshold temperature so as to release the transparent wafer 400a from the stacked wafer SW. Similarly, a UV releasable adhesive and/or a chemical release agent may be used. The materials may be applied to the wafer as a spin-on liquid or as a film or provided as a tape material. As yet another temporary bonding material, a decompression release bonding material may be used. The decompression release bonding material is switched from a bonding characteristic to a non-bonding characteristic to release the bonding material when a release step is performed.

As such, the transparent wafer 400a is removed, and thereafter the dicing process is performed. As illustrated in FIG. 6, since the transparent substrate 400 is not present in the stacked image sensor package, the transparent substrate 400 may be prevented from influencing optical performance of the image sensor. Further, it is possible to prevent the stacked image sensor a from being warped or bowed due to a mismatch in the coefficient of thermal expansion (CTE) between the transparent substrate 400 and the stacked image sensor a.

In some cases, a protection layer 340 for protecting the microlens 320 may be formed on the top of the microlens 320. The protection layer 340 may be formed by a coating process and may have characteristics of water repellency and/or oil repellency for protection from particle contamination during the process.

When an infrared ray blocking layer is coated to perform an infrared color filter function, since the transparent substrate 400 is removed, this may be desired to be complemented. In this case, as illustrated in FIG. 6, a light sensing element structure may be partially modified so as to include an organic photosensitive diode (OPD) that performs the infrared color filter function. Multiple photosensitive diode (PD) arrays may be formed in the pixel array die 100, a color filter (CF) array may be stacked thereon, and the organic photosensitive diode (OPD) that selectively absorbs infrared rays may be formed between the microlens 320 and the color filter (CF) array. The organic photosensitive diode (OPD) includes an organic photoelectric conversion layer 135, and a first electrode 133 and a second electrode 135 formed on both surfaces of the organic photoelectric conversion layer 135, respectively. The second electrode 135 is connected to a floating region or a storage region 180 through the through-via 170.

FIG. 7 is a cross-sectional view schematically illustrating an image sensor module to which a stacked image sensor package is applied according to an example embodiment.

Referring to FIG. 7, the stacked image sensor package illustrated in FIG. 1B is mounted on a circuit substrate 800, such as a printed circuit board or an FPC, and thereafter a lens holder 910 into which a lens 900 is inserted is directly mounted on the stacked image sensor package by using an adhesive (not illustrated). Therefore, since the sizes (e.g., horizontal and vertical widths) of the stacked image sensor a and the lens holder constituting the stacked image sensor package may be formed to be substantially the same as each other, it is desirable to achieve a thin thickness and a small size.

In FIG. 7, it is illustrated that the stacked image sensor package illustrated in FIG. 1B is modularized, but all of the stacked image sensor packages in FIGS. 3 to 6B may be modularized in the same method as FIG. 7.

When the stacked image sensor packages described with reference to FIGS. 1A to 6 are modularized, the pixel array die 100, the logic die 200, and the memory die 600 are sequentially positioned below the lens 900. Further, the external connector 570 that connects the pixel array die 100, the logic die 200, and the memory die 600 with the circuit substrate 800 is positioned on the same plane (e.g., the redistribution layer 500) as the memory die 600. Further, the memory die 600 is laid among the external connectors 570.

While this inventive concepts have been described in connection with what is presently considered to be practical example embodiments, it is to be understood that the inventive concepts are not limited to the disclosed embodiments, but is intended to cover various modifications and similar arrangements included within the spirit and scope of the appended claims.

What is claimed is:

1. A stacked image sensor package comprising:
a stacked image sensor including a pixel array die and a logic die and having a first surface and a second surface, in which the pixel array die and the logic die are stacked;
a redistribution layer on the first surface of the stacked image sensor, the redistribution layer configured to reroute an input/output of the stacked image sensor, the redistribution layer including a first pad and a second pad;
a memory die connected with the first pad of the redistribution layer and positioned on the stacked image sensor, the memory die having a thickness; and
at least two external connectors connected with the second pad,
the at least two external connectors configured to connect the memory die and the stacked image sensor with an external device,
the at least two external connectors having the memory die therebetween.

2. The stacked image sensor package of claim 1, further comprising:
a wafer bonding interface between the pixel array die and the logic die.

3. The stacked image sensor package of claim 1, wherein a height of the at least one of the at least two external connectors is greater than the thickness of the memory die.

4. The stacked image sensor package of claim 1, further comprising:
a microlens on the second surface of the stacked image sensor;
a transparent substrate configured to face the microlens and stacked on the second surface of the stacked image sensor; and
a transparent bonding layer between the microlens and the transparent substrate.

5. The stacked image sensor package of claim 4, wherein: the transparent substrate includes an infrared ray blocking filter.

6. The stacked image sensor package of claim 1, further comprising:
a microlens on the second surface of the stacked image sensor;
a transparent substrate facing the microlens and stacked on the second surface of the stacked image sensor; and
a partition at an area other than an area where the microlens includes an air gap between the microlens and the transparent substrate.

7. The stacked image sensor package of claim 6, wherein the transparent substrate is coated with an infrared ray blocking filter.

8. The stacked image sensor package of claim 1, further comprising:
a microlens on the second surface of the stacked image sensor; and
a protection layer on the microlens and exposed to an external environment of the stacked image sensor package.

9. The stacked image sensor package of claim 1, wherein the logic die includes a through-via of which one end is connected with an input/output pad of the logic die and the other end is connected with the redistribution layer.

10. The stacked image sensor package of claim 1, wherein the memory die includes a plurality of memory dies.

11. The stacked image sensor package of claim 10, wherein:
the plurality of memory dies are connected with each other through a through-via.

12. A stacked image sensor module comprising:
a lens;
a circuit substrate;
a stacked image sensor positioned between the lens and the circuit substrate, wherein the stacked image sensor includes a pixel array die and a logic die that are stacked;
a memory die positioned below the lens; and
at least two external connectors connecting the stacked image sensor and the memory die with the circuit substrate are positioned on the same plane as the memory die,
wherein the memory die is positioned between the at least two external connectors.

13. The stacked image sensor module of claim 12, further including:
a wafer bonding interface between the pixel array die and the logic die.

14. The stacked image sensor module of claim 12, further comprising:
a transparent substrate between the lens and the stacked image sensor, the transparent substrate including a coating of an infrared ray blocking filter.

15. The stacked image sensor module of claim 12, wherein:
widths of a lens holder into which the lens is inserted, and of the stacked image sensor, are substantially the same as each other.

* * * * *